United States Patent

Yeung et al.

[11] Patent Number: 6,051,997
[45] Date of Patent: Apr. 18, 2000

[54] CIRCUIT FOR TRACKING RAPID CHANGES IN MID-POINT VOLTAGE OF A DATA SIGNAL

[75] Inventors: On Au Yeung; Nicholas Weiner, both of Singapore, Singapore

[73] Assignee: Motorola, Inc., Schaumburg, Ill.

[21] Appl. No.: 09/076,412

[22] Filed: May 12, 1998

[30] Foreign Application Priority Data

Jun. 2, 1997 [SG] Singapore ............................ 9701856

[51] Int. Cl.[7] .................................................. G01R 19/00
[52] U.S. Cl. ................................ 327/58; 327/14; 327/98; 327/558
[58] Field of Search .................................. 327/14, 15, 16, 327/17, 28, 29, 30, 58–61, 62, 90, 98–378, 379, 510, 512, 513, 553, 555, 558

[56] References Cited

U.S. PATENT DOCUMENTS

| | | | |
|---|---|---|---|
| 4,914,398 | 4/1990 | Jove et al. ............................ | 328/167 |
| 5,025,251 | 6/1991 | Mittel et al. ............................ | 375/76 |
| 5,057,785 | 10/1991 | Chung et al. ............................ | 328/162 |
| 5,923,219 | 7/1999 | Ide et al. ............................ | 330/308 |

Primary Examiner—Jeffrey Zweizig
Attorney, Agent, or Firm—Rennie William Dover

[57] ABSTRACT

A circuit (11) for tracking rapid changes in peak and trough voltages of a data signal includes a peak detector circuit (13) and a trough detector circuit (14) coupled to the input for detecting peaks and troughs in the data signal and providing a peak and trough detect output signals, respectively. A peak level rate of change detector (17) is coupled to the peak detector circuit (13) for detecting a rate of increase in the voltage level of detected peaks and to the trough detector circuit (14) for controlling the trough detector circuit to detect troughs when the voltage level of detected peaks rises rapidly. Similarly, a trough level rate of change detector (18) is coupled to the trough detector circuit (14) for detecting a rate of decrease in the voltage level of detected troughs and to the peak detector circuit (13) for controlling the peak detector circuit (13) to detect peaks when the voltage level of detected troughs falls rapidly.

8 Claims, 3 Drawing Sheets

CIRCUIT FOR TRACKING RAPID CHANGES IN MID-POINT VOLTAGE OF A DATA SIGNAL

FIELD OF THE INVENTION

This invention relates to a circuit for tracking rapid changes in the mid-point voltage of a data signal, and in particular for tracking rapid changes in the DC level of a bias voltage upon which a small AC data signal has been superimposed.

BACKGROUND OF THE INVENTION

In a Hard Disk Drive (HDD) system having a Magneto-Resistive (MR) head for reading data from the disk, the output from the MR head takes the form of a small AC data signal superimposed upon a DC bias voltage. The MR head is located very close to the disk, which spins very rapidly. Accordingly, if there are surface imperfections or an extraneous particle lying on the surface of the disk, the MR head can impact the imperfection or particle at high speed. This causes the MR head to heat up rapidly and then to return to its normal operating temperature more slowly. Since the DC bias voltage is sensitive to temperature, such impacts cause bias transients, known as thermal asperities, to appear in the head output signal.

Thus, a thermal asperity is characterized by a rapid step of the DC bias voltage in one direction, followed by a relatively slow decay back to the normal value. The transient typically has a step time on the order of tens of nano seconds and a decay time constant of micro seconds. The step is always in the same direction for a particular circuit, but whether it is positive or negative depends on the architecture of the circuit. The AC data signal superimposed on the DC bias signal is not significantly affected.

In order to be able to recover the AC data signal for the duration of the thermal asperity it is necessary to effectively remove the transient from the DC bias voltage. However, since the bias transient has components in the same frequency range as the AC data signal, it is therefore difficult to separate the AC component from the DC bias using a linear filter. Typical known techniques involve detection of the mid-point DC voltage by using rectifier peak and trough detectors, whose outputs are then combined to provide the mid-point voltage. Transients in the DC bias voltage can then be subtracted from the input signal.

One such circuit is disclosed in U.S. Pat. No. 4,914,398 (Jove) in which the peak and trough detectors are capacitively coupled via a buffer to allow both detectors to follow the initial rapid step in the DC bias voltage level. Their sum is then filtered by a non-linear signal-adaptive filter before being subtracted from the (delayed) input signal. The problem with this technique is that it does not include a mechanism for allowing tracking of the DC mid-point level during the decay back to the normal operating point.

BRIEF SUMMARY OF THE INVENTION

The present invention therefore seeks to provide a circuit for tracking rapid changes in the mid-point voltage of a data signal which overcomes, or at least reduces the above-mentioned problems of the prior art.

Accordingly, the invention provides a circuit for tracking rapid changes in peak and trough voltages of a data signal, the circuit comprising: an input for receiving a data signal superimposed on a bias voltage; a peak detector circuit coupled to the input for detecting peaks in the data signal and providing a peak detect output signal indicative of detected peaks; a trough detector circuit coupled to the input for detecting troughs in the data signal and providing a trough detect output signal indicative of detected troughs; the circuit further comprising: a peak level rate of change detector coupled to the peak detector circuit for detecting a rate of increase in the voltage level of detected peaks and to the trough detector circuit for controlling the trough detector circuit to detect troughs when the voltage level of detected peaks rises rapidly; and a trough level rate of change detector coupled to the trough detector circuit for detecting a rate of decrease in the voltage level of detected troughs and to the peak detector circuit for controlling the peak detector circuit to detect peaks when the voltage level of detected troughs falls rapidly; wherein one of said peak and trough level rate of change detectors is selectively coupled for controlling the respective trough or peak detector circuit.

In a preferred embodiment, the circuit further comprises a mid-point determining circuit having inputs coupled to the peak and trough detector circuits for receiving the peak detect and trough detect output signals and an output providing a mid-point signal indicative of the mid-point between the peak detect and trough detect output signals.

Preferably, the circuit further comprises a comparator circuit having a first input for receiving a reference voltage having a predetermined level, a second input coupled to the output of the mid-point determining circuit for comparing the mid-point signal with the reference voltage and an output providing an output signal indicative of whether the mid-point signal is above or below the reference voltage, the output of the comparator being used for controlling said selective coupling.

In one embodiment the circuit further comprises a low-pass filter having at least one cut-off frequency controlling input coupled to at least one of the peak and trough level rate of change detectors for controlling the cut-off frequency according to the rate of change in the voltage level of detected peaks or troughs. Alternatively or additionally, the low-pass filter preferably has a further cut-off frequency controlling input coupled to the output of the comparator circuit for controlling the cut-off frequency according to the output of the comparator circuit.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
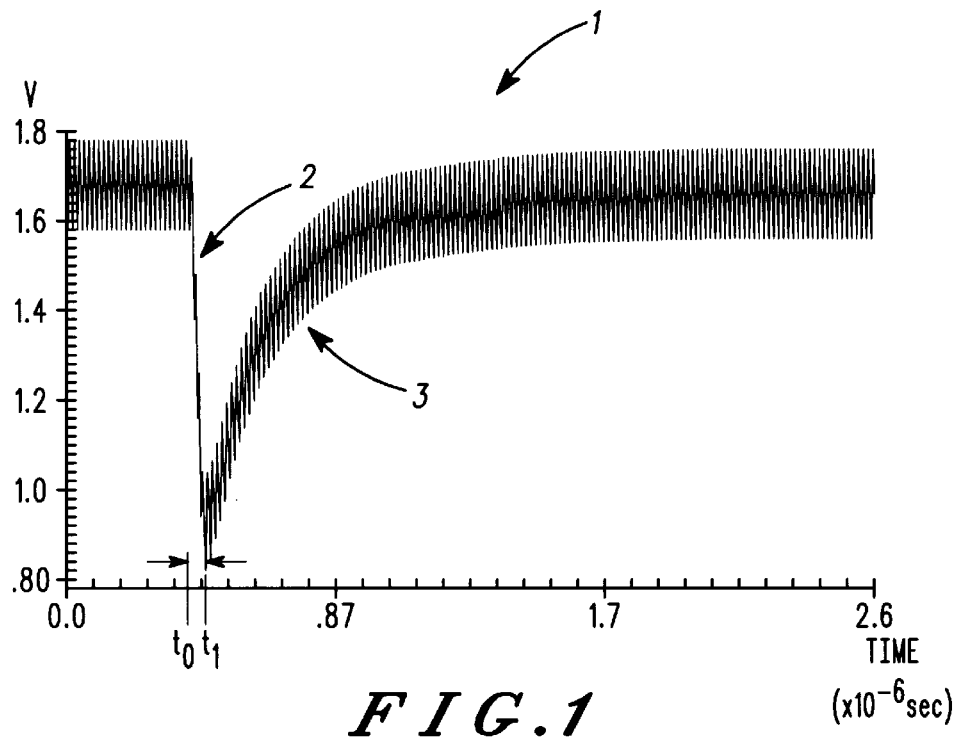
FIG. 1 shows an example of an output signal from an MR head during a thermal asperity.

Thus, as shown in FIG. 1, a typical input waveform 1 comprises a small a.c. signal superimposed upon a bias voltage. A thermal asperity starts at time $t_0$. The bias voltage undergoes a step 2 several times the size of the a.c. signal and then undergoes an exponential decay 3 back to its normal value. The step 2 takes time $t_1$, which is typically a few tens of nano seconds. The decay 3 to the normal value has a time constant T, which is typically about a micro second. The signal frequency has components of over 100 MHz for a typical Hard Disk Drive.

Figure 2:
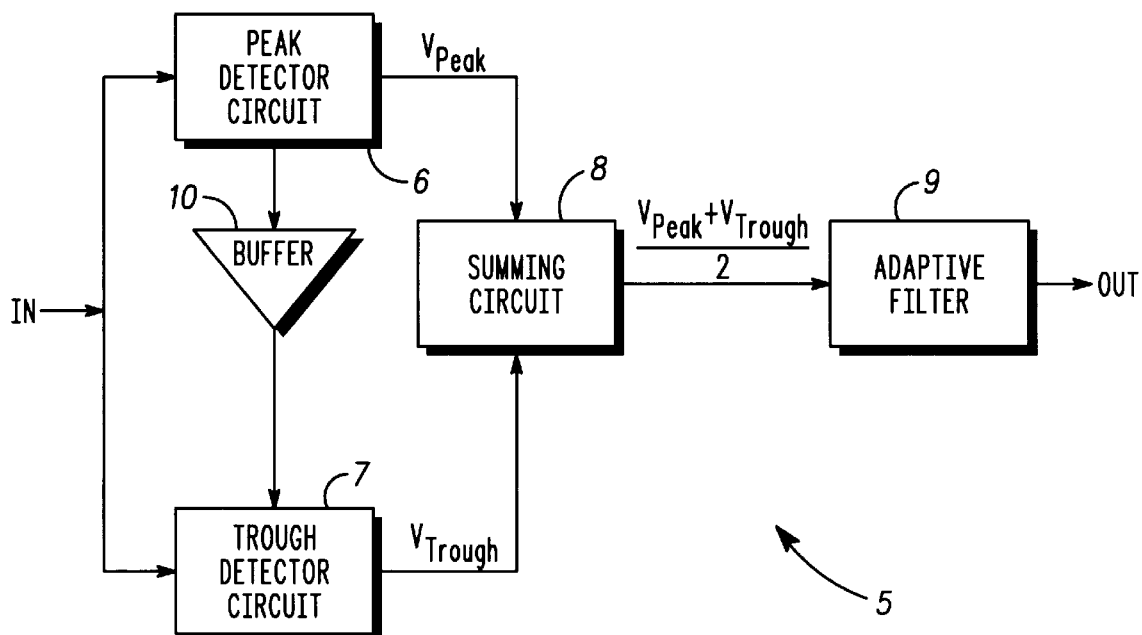
FIG. 2 shows a typical prior art circuit, similar to that disclosed in the U.S. Patent mentioned above.

FIG. 2 shows a block diagram of a mid-point tracking circuit similar to that disclosed in U.S. Pat. No. 4,914,398 (Jove at al). In this circuit 5 an input signal, similar to that shown in FIG. 1, is connected to a peak detector circuit 6 and to a trough detector circuit 7. Outputs from the peak and trough detector circuits 6 and 7 are connected to a summing circuit 8, whose voltage output is at the midpoint between the peak and the trough voltages. The output from the summing circuit 8 is connected to a non-linear signal adaptive filter 9.

The peak detector circuit 6 responds immediately to rapidly increasing peak voltages, but responds very slowly to decreasing peak voltages. The trough detector circuit 7 responds immediately to rapidly decreasing trough voltages, but responds very slowly to increasing trough voltages.

To enable both detector circuits 6 and 7 to respond to the rapid step at the start of a thermal asperity, the circuit 5 includes a buffer 10 between the peak and trough detector circuits 6 and 7.

The signal adaptive filter 9 is a low-pass filter, used to reduce the amplitude of the ac component present at the output of the summing circuit 8. The cut-off frequency is normally at a very low frequency (with respect to the signal frequency), but adapts to enable the output to follow rapid changes in the input bias voltage. The adaptation is achieved by comparing the input and output voltages of the filter. If these voltages differ by more that a predetermined value, then the output will rapidly track the input. This filter is "signal adaptive", i.e. the cut-off frequency is controlled by the input signal, and does not involve further control inputs to the filter. In this circuit 5, the output signal is then subtracted from the input signal, but this is not shown in the drawing.

Figure 3:
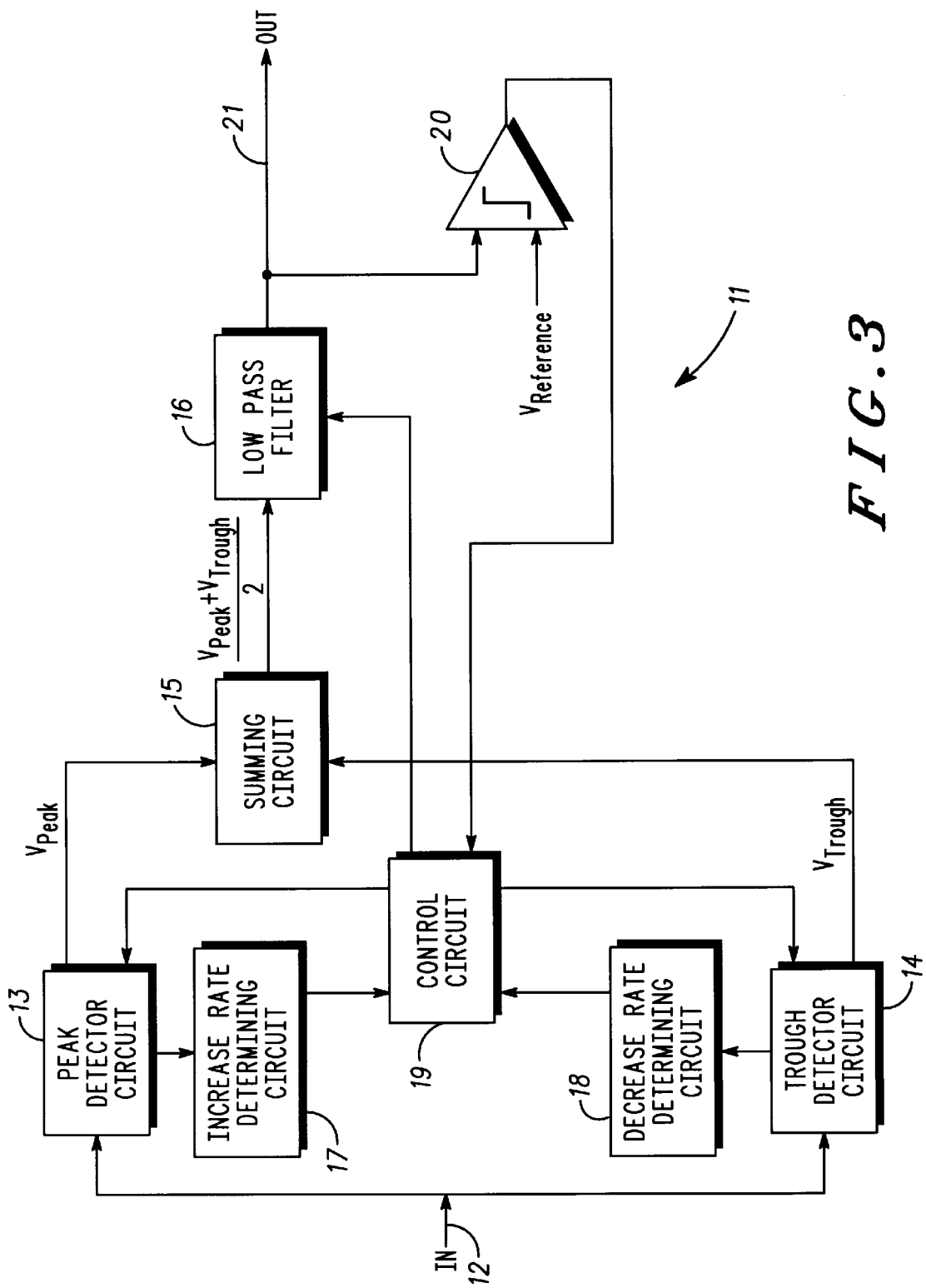
FIG. 3 shows a block diagram of a circuit according to one embodiment of the present invention.

FIG. 3 shows a block diagram of one embodiment of a circuit 11 for tracking rapid changes in the mid-point voltage of a data signal according to the present invention. In this embodiment, an input signal applied to input terminal 12 is connected to a peak detector circuit 13 and a trough detector circuit 14. Outputs from the peak and trough detector circuits 13 and 14 are connected to a summing circuit 15, whose voltage output is at a level which is the midpoint between the peak and the trough voltages. The output from the summing circuit 15 is connected to a linear low pass filter (LPF) 16.

The peak detector circuit 13 has an additional output coupled to a circuit 17 for determining the rate of increase of the peak voltage and trough detector circuit 14 has an additional output coupled to a circuit 18 for determining the rate of decrease of the trough voltage. The circuits 17 and 18 thus have outputs that are proportional to the rate of increase of peak voltage, and rate of decrease of trough voltage, respectively. The outputs from the circuits 17 and 18 are applied to a control circuit 19, which has a third input taken from an output from a comparator circuit 20.

The control circuit 19 has three outputs. One output is coupled to an additional input of the peak detector circuit 13 to cause the peak detector circuit 13 to track rapidly decreasing peak voltages (e.g. at the start of a thermal asperity). A second output is coupled to an additional input of the trough detector circuit 14 to cause the trough detector circuit 14 to track rapidly increasing trough voltages (e.g. as the mid-point voltage returns to its normal value). A third ouput is coupled to a control input of the LPF 16 to control the cut-off frequency of the LPF 16. Without these additional inputs the peak detector circuit 13 would respond immediately to rapidly increasing peak voltages, but very slowly to decreasing peak voltages and the trough detector circuit 14 would respond immediately to rapidly decreasing trough voltages, but very slowly to increasing trough voltages.

The LPF 16 attenuates the a.c. component that is present at the output of the summing circuit 15 and provides an output which is coupled to an output terminal 21 of the circuit 11. The filter 16 has several control inputs (represented in FIG. 3 by a single line) to control its cut-off frequency. During normal operation the cut-off frequency is very low compared to the signal frequency. The control function adjusts the cut-off frequency to enable the filter 16 output to track the voltage step at the start of a thermal asperity, and also to track the mid-point voltage as it decays back to it normal value.

The comparator circuit 20 has a first input taken from the output of the LPF 16 and a second input for receiving a reference voltage. The output of the comparator circuit 20 indicates when the mid-point voltage differs from a normal value by comparing the output of the LPF 16 with the reference voltage, which is at a predetermined voltage offset from the normal midpoint voltage. This output from the comparator circuit is then passed back to the control circuit 19.

Usually, the output signal at the output terminal 21 is then subtracted from the input signal, but this is not shown in the drawing.

Figure 4:
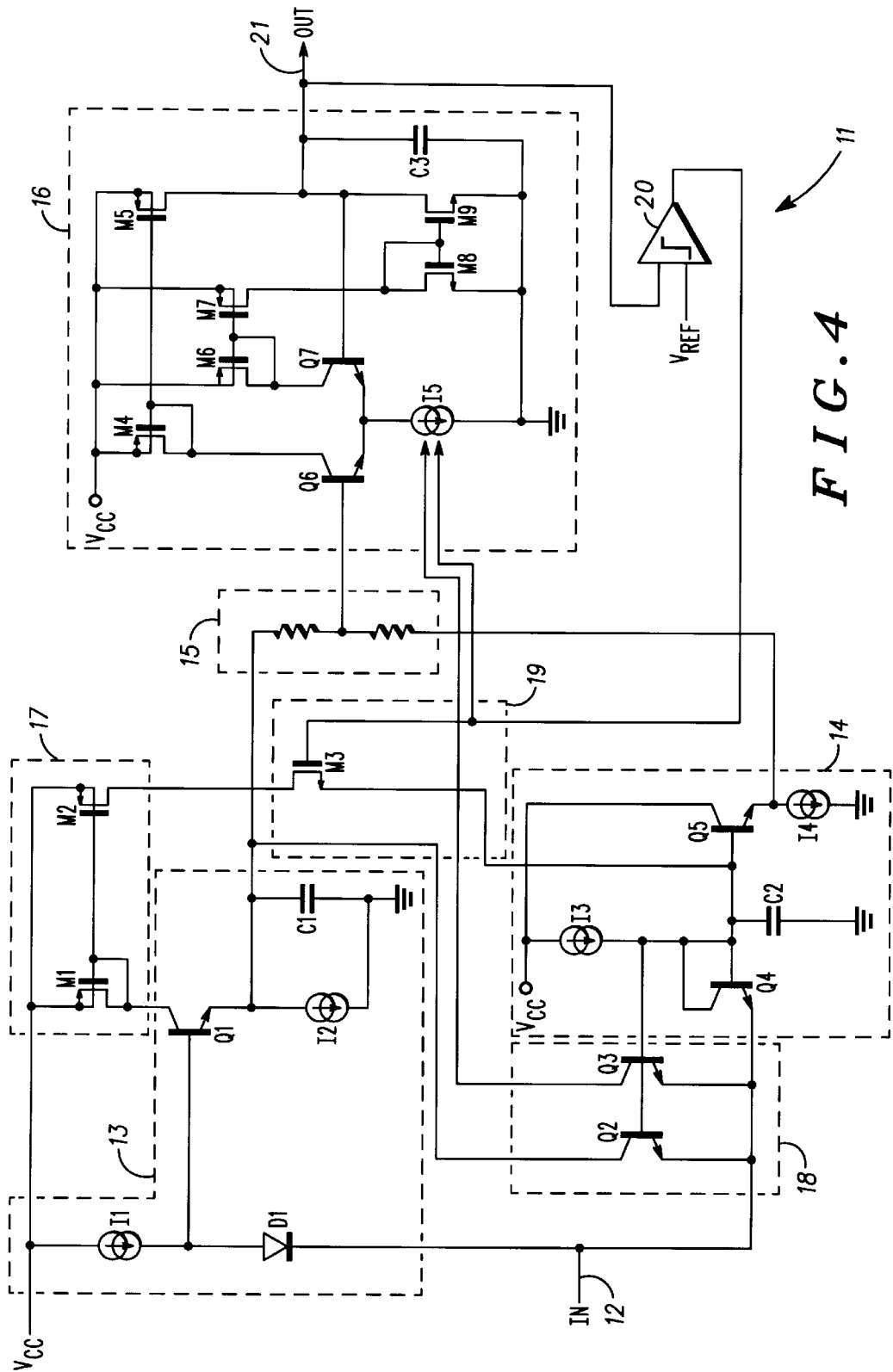
FIG. 4 shows a detailed circuit diagram of an implementation of the embodiment shown in FIG. 3.

FIG. 4 shows a detailed circuit diagram of an implementation of the embodiment shown in FIG. 3. As can be seen, the peak detector circuit 13 is made up of a pair of current sources I1 and I2, a diode D1, a transistor Q1 and a capacitor C1. Current source I1 is coupled between a voltage supply line Vcc and diode D1 and the base of transistor Q1. Current source I2 is coupled between the emitter of transistor Q1 and a ground reference potential and capacitor C1 is similarly coupled between the emitter of transistor Q1 and a ground reference potential. Thus, current source I1 and diode D1 provide a level shifting function, while current source I2 slowly discharges capacitor C1.

Transistor Q1 charges capacitor C1 whenever its base voltage is high enough to turn transistor Q1 on. This happens whenever the input voltage on input terminal 12, which is coupled to the diode D1, exceeds the voltage on capacitor C1. Hence, during input voltage peaks, the voltage on capacitor C1 follows the input voltage, and between peaks the voltage on capacitor C1 slowly decreases.

The trough detector circuit 14 is made up of current sources I3 and I4, transistors Q4 and Q5 and capacitor C2. The current source I3 is coupled between the voltage supply line Vcc and the base and collector of transistor Q4. Transistor Q5 has its base coupled to the base of transistor Q4, its collector coupled to the voltage supply line Vcc and its emitter coupled to the current source I4, whose other side is coupled to a ground reference potential. The capacitor C2 is coupled between the ground reference potential and the bases of transistors Q4 and Q5. Thus, current source I4 and transistor Q5 provide a level shifting function and current source I3 slowly charges capacitor C2.

Capacitor C2 discharges via transistor Q4 whenever its emitter voltage is low enough to turn it on. This happens whenever the input voltage on input terminal 12, coupled to the emitter of transistor Q4, is less than at the trough detector output (i.e. the emitter of Q5). Hence, during input voltage troughs, the voltage on capacitor C2 follows the input voltage, and between troughs the voltage on capacitor C2 slowly increases.

The summing circuit 15 comprises the two equal value resistors R1 and R2. These are coupled in series between the emitter of transistor Q1 and the emitter of transistor Q5 and are large enough so that the current through them is small compared to the values of the currents from current sources I2 and I3. The voltage at the output of the summing circuit, at the junction between the two resistors R1 and R2, is the mid point between the output voltages of the peak and trough detector circuits 13 and 14.

The LPF 16 is made up of a transconductance amplifier, connected as unity gain buffer, and a load capacitor C3. The transconductance amplifier is formed by differential input transistors Q6 and Q7, three current mirrors made up of transistors M4 and M5, transistors M6 and M7, and transistors M8 and M9, respectively, and a controllable current source I5. The pole frequency of the filter is proportional to the transconductance of the amplifier, which is in turn proportional to the current from current source I5.

The circuit 18 for determining the rate of decrease of the trough voltage provides an output that is proportional to the rate of decrease of the voltage on capacitor C2. This rate of decrease is determined by monitoring the current discharging from capacitor C2 via transistor Q4. The discharging current is detected using transistors Q2 and Q3, both having their emitters coupled to the emitter of transistor Q4 and their bases coupled to the base of transistor Q4. Transistors Q2 and Q3 provide two identical output currents at their collectors. The collector of transistor Q2 is coupled to the emitter of transistor Q1 and the collector of transistor Q3 is coupled to the transconductance amplifier.

The circuit 17 for determining the rate of increase of the peak voltage provides an output that is proportional to the rate of increase of the voltage on capacitor C1. This rate of increase is determined by monitoring the current charging capacitor C1 via transistor Q1. The charging current is detected using a current mirror formed by transistors M1 and M2.

The comparator circuit 20 is not shown in detail. The comparator output indicates when the output voltage from the LPF 16 differs by more than a predetermined offset voltage from its normal value. This happens during a thermal asperity.

In this implementation the control circuit 19 is formed by transistor M3, whose drain is coupled to the output of the current mirror formed by transistors M1 and M2, whose source is coupled to the bases of transistors Q4 and Q5 and whose gate is coupled to the output of the comparator circuit 20. The circuit 11 thus operates as follows:

The output current from transistor Q2 directly discharges the peak detect capacitor C1. Hence, during rapid decreases in trough voltage (such as at the start of a thermal asperity) both capacitors C2 and C1 are discharged.

The output current from transistor Q3 is added to the LPF bias current to increase the filter cut-off frequency when a rapid decrease in trough voltage occurs.

Depending upon the output from the comparator circuit 20, transistor M3 enables the output current from transistor M2 to charge the trough detect capacitor C2. Hence, during a thermal asperity the voltage on the trough detect capacitor C2 tracks the troughs in the input signal as the mid-point voltage returns to its normal voltage.

The comparator circuit 20 also controls the LPF bias current so that during a thermal asperity, as the mid-point voltage returns to its normal value, the filter cut-off frequency is higher than normal.

It will be appreciated that although only one particular embodiment of the invention has been described in detail, various modifications and improvements can be made by a person skilled in the art without departing from the scope of the present invention.

What we claim is:

1. A circuit for tracking rapid changes in peak and trough voltages of a data signal, the circuit comprising:
    an input for receiving a data signal superimposed on a bias voltage;
    a peak detector circuit coupled to the input for detecting peaks in the data signal and providing a peak detect output signal indicative of detected peaks;
    a trough detector circuit coupled to the input for detecting troughs in the data signal and providing a trough detect output signal indicative of detected troughs;
    the circuit further comprising:
    a peak level rate of change detector coupled to the peak detector circuit for detecting a rate of increase in the voltage level of detected peaks and to the trough detector circuit for controlling the trough detector circuit to detect troughs when the voltage level of detected peaks rises rapidly; and
    a trough level rate of change detector coupled to the trough detector circuit for detecting a rate of decrease in the voltage level of detected troughs and to the peak detector circuit for controlling the peak detector circuit to detect peaks when the voltage level of detected troughs falls rapidly;
    wherein one of said peak and trough level rate of change detectors is selectively coupled for controlling the respective trough or peak detector circuit.

2. A circuit according to claim 1, further comprising:
    a mid-point determining circuit having inputs coupled to the peak and trough detector circuits for receiving the peak detect and trough detect output signals and an output providing a mid-point signal indicative of the mid-point between the peak detect and trough detect output signals;
    a low-pass filter having an input coupled to receive the mid-point signal, at least one cut-off frequency controlling input coupled to at least one of the peak and trough level rate of change detectors, and an output for providing an output signal, the low-pass filter for controlling the cut-off frequency according to the rate of change in the voltage level of detected peaks or troughs; and
    a comparator circuit having a first input for receiving a reference voltage having a predetermined level and a second input coupled to the output of the low-pass filter, the comparator for comparing the output signal from the low-pass filter with the reference voltage, and the comparator having an output for providing a comparator output signal indicative of whether the output signal is above or below the reference voltage, the comparator output signal being used for controlling said selective coupling.

3. A circuit according to claim 1, wherein the peak detector circuit includes a capacitor selectively coupled to a voltage source for charging the capacitor when a voltage level of the data signal at the input is sufficiently greater than a voltage level on the capacitor, and the peak level rate of change detector comprises a current sensing circuit coupled to the capacitor for detecting the current provided by the voltage to the capacitor and producing an output indicative thereof.

4. A circuit according to claim 3, wherein the current sensing circuit comprises a current mirror having a sensing transistor coupled so as to sense the current charging the capacitor.

5. A circuit according to claim 1, wherein the trough detector circuit includes a capacitor selectively coupled to the input for discharging the capacitor when a voltage level of the data signal at the input is sufficiently lower than a voltage level on the capacitor, and the trough level rate of change detector comprises a current sensing circuit coupled to the capacitor for detecting the current discharging from the capacitor and producing an output indicative thereof.

6. A circuit according to claim 5, wherein the current sensing circuit comprises a current mirror having a sensing transistor coupled so as to sense the current discharging the capacitor.

7. A circuit according to claim 2, wherein the peak detector circuit includes a capacitor selectively coupled to a voltage source for charging the capacitor when a voltage level of the data signal at the input is sufficiently greater than a voltage level on the capacitor, and the peak level rate of change detector comprises a current sensing circuit coupled to the capacitor for detecting the current provided by the voltage to the capacitor and producing an output indicative thereof.

8. A circuit according to claim 2, wherein the trough detector circuit includes a capacitor selectively coupled to the input for discharging the capacitor when a voltage level of the data signal at the input is sufficiently lower than a voltage level on the capacitor, and the trough level rate of change detector comprises a current sensing circuit coupled to the capacitor for detecting the current discharging from the capacitor and producing an output indicative thereof.

* * * * *